United States Patent [19]
Huber et al.

[11] Patent Number: 5,247,254
[45] Date of Patent: Sep. 21, 1993

[54] DATA RECORDING SYSTEM INCORPORATING FLAW DETECTION CIRCUITRY

[75] Inventors: William D. Huber, San Jose; William R. McKee, Pleasanton; Bruce Buxton, Saratoga; Don Orbin, Santa Clara; Emilio Lam, San Jose, all of Calif.

[73] Assignee: Maxtor Corporation, San Jose, Calif.

[21] Appl. No.: 847,326

[22] Filed: Mar. 6, 1992

Related U.S. Application Data

[63] Continuation-in-part of Ser. No. 631,894, Dec. 21, 1990, Pat. No. 5,121,057.

[51] Int. Cl.[5] .............. G01R 33/12; G11B 27/00; G01N 27/82
[52] U.S. Cl. .................... 324/212; 360/25; 369/58
[58] Field of Search ............... 324/210, 212; 360/25, 360/31; 369/58; 371/21.1, 21.2

[56] References Cited

U.S. PATENT DOCUMENTS 4,754,222  6/1988  Felleisen et al. ............ 324/212

FOREIGN PATENT DOCUMENTS 0006474  1/1983  Japan ....................... 324/212
0430321 10/1974  U.S.S.R. .................. 324/212

*Primary Examiner*—Gerard R. Strecker

[57] ABSTRACT

An improved data recording system incorporates a detection circuit directly into the data read channel circuitry of the recording system to provide the capability of automatic self-testing and mapping of media flaws. The flaw detection circuit outputs an error signal in response to distortions in the readback signal caused by a defect on the medium. Firmware code is utilized for controlling the scanning of the medium by the flaw detection circuit and for recording the locations of the defects on the medium in response to the error signal. The detection circuit itself comprises a phase-splitter for splitting the readback signal into in-phase and quadrature-phase components. These components are then squared and summed to generate a phase independent flaw signal having an amplitude modulated in relation to the locations of the defects.

16 Claims, 7 Drawing Sheets

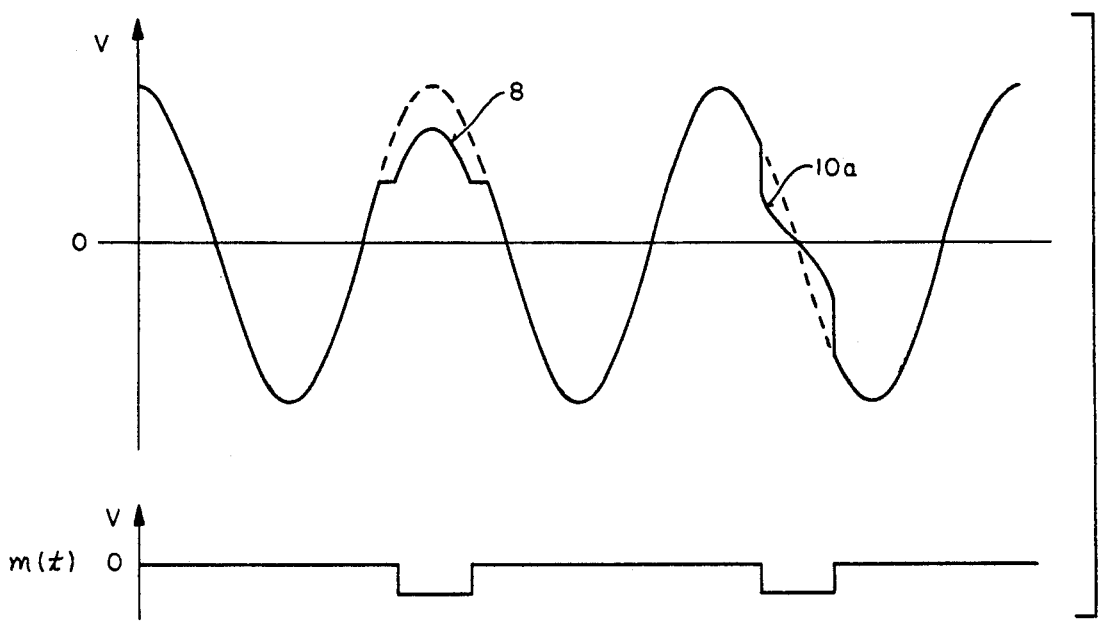
FIG_1A DROP-OUTS
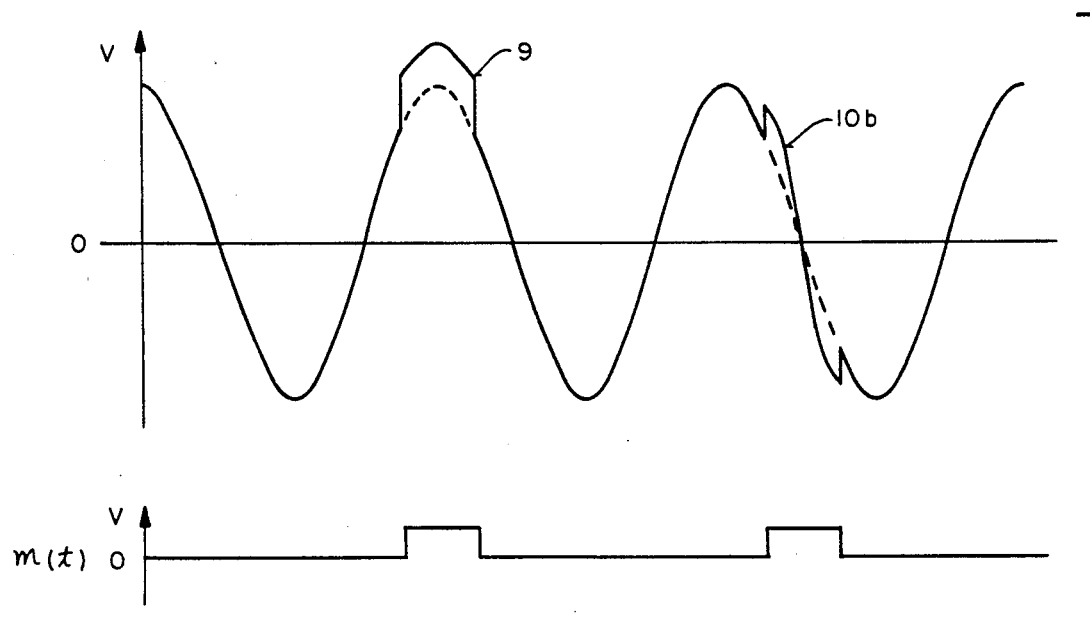
FIG_1B DROP-INS

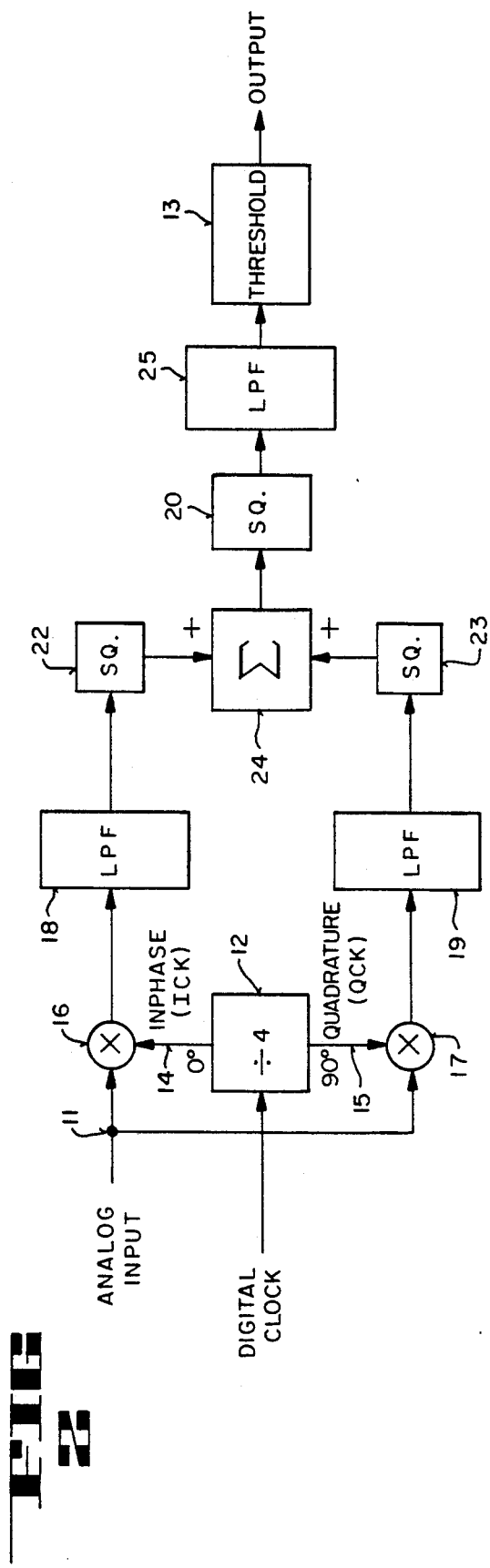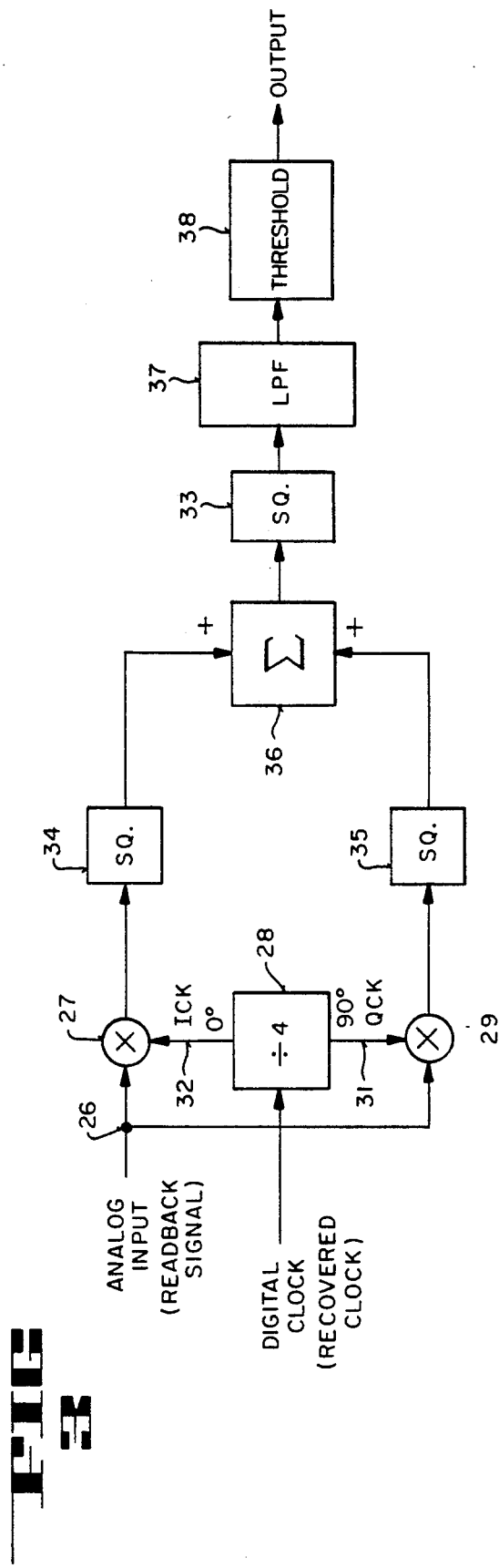

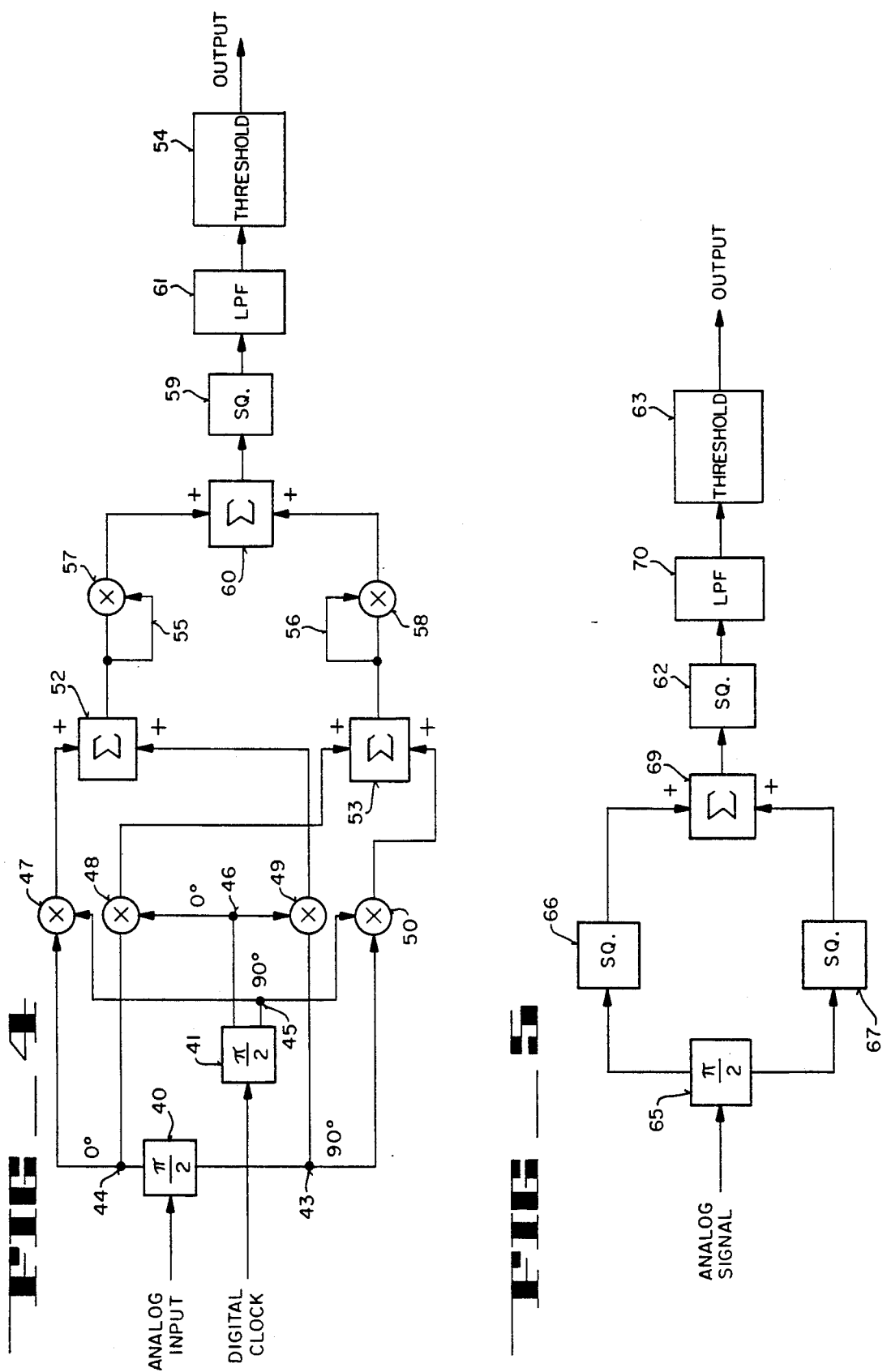

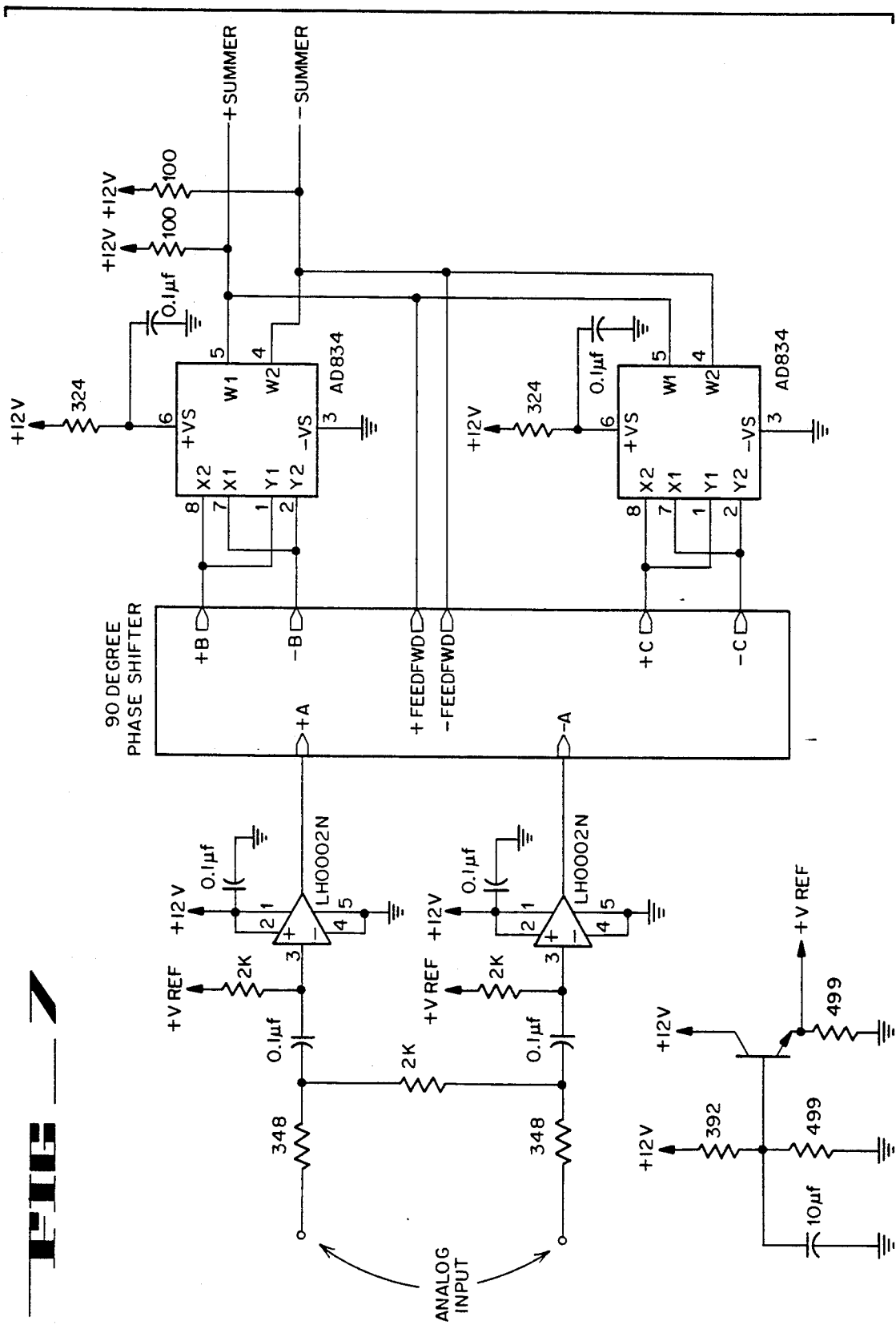
FIG__7

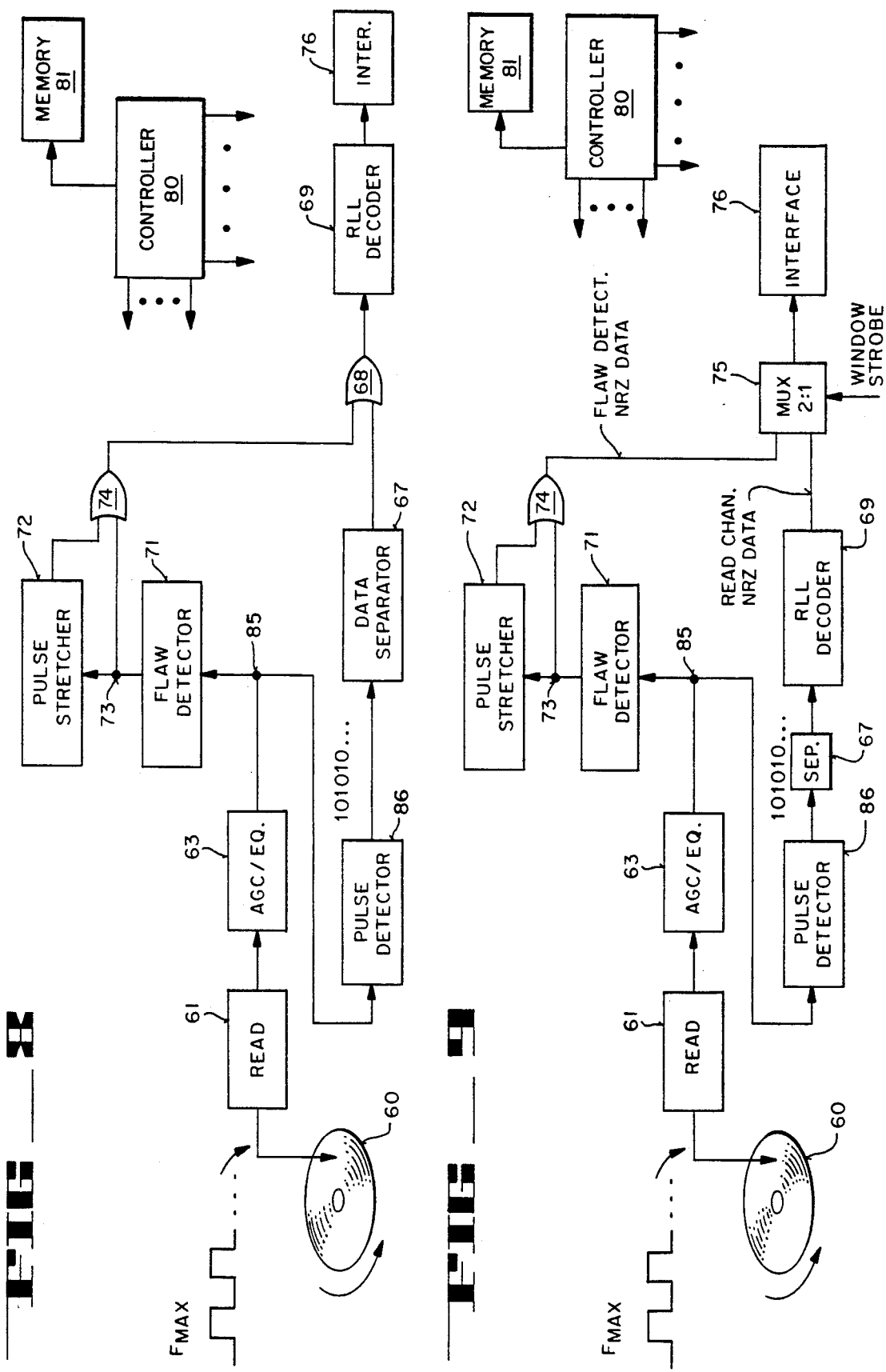

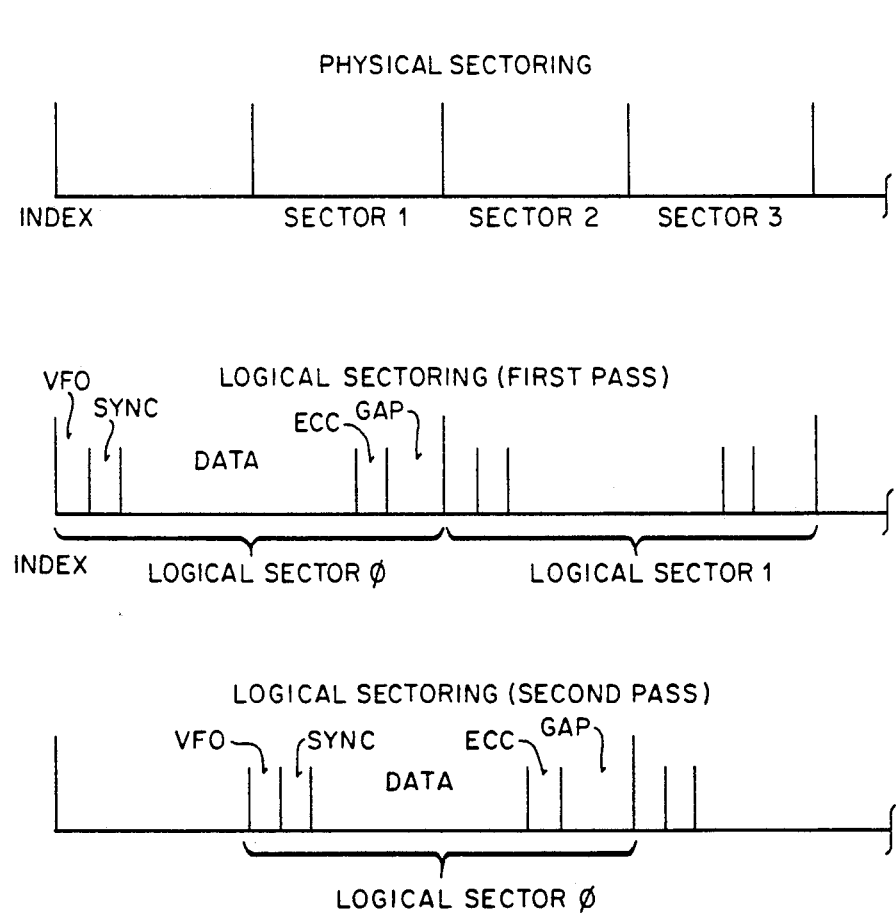
FIG_10

DATA RECORDING SYSTEM INCORPORATING FLAW DETECTION CIRCUITRY

RELATED APPLICATIONS

This is a continuation-in-part (CIP) application of Ser. No. 07/631,894, filed Dec. 21, 1990, now issued as U.S. Pat. No. 5,121,057 which is assigned to the assignee of the present invention.

FIELD OF THE INVENTION

The present invention relates to the field of data storage on recording media. More specifically, the invention relates to methods and apparatus for detecting recording media defects; and also for automatically managing data recording system operations to overcome these defects.

BACKGROUND OF THE INVENTION

Rigid-disk files consist of a stack of circular disks having a thin magnetic coating rotating at high speed. Data is recorded on the disk surfaces using heads of transducers mounted on actuator arms that are moved across the disk surfaces by a high-speed actuator. The actual information is recorded in circumferential tracks on the disk surfaces. Reading the recorded information back involves sensing the magnetic transitions emanating from the surface of the rigid-disk, again using the transducers.

The ability to store and read back information from the disk in the form of magnetic transitions may be impaired by the presence of disk defects. Disk defects can manifest themselves in several ways. One way is simply as noise associated with the random nature of the disk surface. Often, this noise can be easily separated from the ambient noise in the readback channel by measuring the noise from the preamplifier with the head flying over the disk and then repeating the measurement with the head unloaded from the disk.

More troublesome are flaws or defects in the disk surface that manifest themselves as missing bits or extra bits of data (i.e., single bit errors). Missing bits are reductions in the amplitude of the envelope of the signal, usually over a small number of bits (e.g., 1-4 bits), such that the amplitude falls below the channel-detector clipping level. The number of missing bits observed depends on the setting of the clipping level in the readback channel. One common technique for avoiding the problem of missing or extra bits is to perform a surface analysis of the rigid disk. This surface analysis yields an error map of the rigid-disk surface. The error map can then be referred to as a means of avoiding localized disk flaws.

Surface analysis consists of scanning all of the data tracks on the disk for defects. The located defects are placed in a defect list which is available to disk formatter programs. This allows the formatter programs to write sector headers that identify defective sectors so that these sectors remain unused. Obviously, all of this depends on having the capability of detecting the presence of a randomly located disk defect or flaw. Over the years, various techniques for detecting disk defects have been developed.

In many modern disk-drive recording systems, the playback waveform at the highest analog frequency data pattern is a sinusoid waveform. According to one common approach, media defects are detected by writing this high frequency data pattern and then looking for deviations from the expected sinusoid upon playback. Since the expected signal is a sinusoid, a very narrow band tracking notch filter has been traditionally employed to effectively exclude the sinusoid and pass the deviations.

In the frequency domain these deviations correspond to phase and/or amplitude modulation sidebands about the carrier. While prior art systems have been generally capable of amplitude error detection, unfortunately they have failed to provide effective simultaneous phase error detection. This means that disk flaws which generate phase rather than amplitude deviations almost always go undetected. Moreover, the error resolution of past systems was generally no better than the byte level. In other words, smaller errors (having a resolution of a single bit location) could routinely pass undetected.

A further disadvantage characteristic of prior art approaches to media flaw detection is the relatively high expense and complexity of circuit components required. Very often, modern flaw detection circuitry demands external gain control and phase-lock-loop (PLL) circuitry which is not readily integrated into the disk drive system.

What is needed then is an effective, simple and inexpensive defect detection system that may be used to reliably identify the locations of flaws on a magnetic recording media. As will be seen, the present invention provides an improved apparatus and method for detecting flaws that is easily integrated into a disk drive system, thus enabling the system to create its own error map without the usual large capital equipment investment in the manufacturing operation. Furthermore, the invention is readily integrated into existing recording channel devices at very little incremental cost. Thus, the drive system of the present invention is capable of mapping its own flaws during the assembly or testing stage of manufacture (e.g., prior to shipment), and also later, in the customer's installation.

Alternatively, the circuit components may be packaged as a small test module to be temporarily plugged into the drive during the flaw mapping process as part of the disk drive manufacturing process.

In either embodiment, the flaw detector of the present invention is capable of detecting flaws down to the single bit level. In addition, its performance is independent of the flaw position relative to the recorded magnetic transitions. Due to this phase independence, a much more reliable flaw map can be formed in a single pass.

SUMMARY OF THE INVENTION

An improved disk drive system which incorporates a media flaw detection apparatus directly into the data channel circuitry of the drive is disclosed. The disk drive system includes a magnetic recording medium, a means for producing a readback signal for a previously encoded bit pattern stored on the medium, a means for decoding the readback signal to reproduce the bit pattern.

The improvement comprises adding a flaw detection circuit means into the drive unit for detecting defects on the medium. The flaw detection circuit means outputs an error signal in response to distortions in the readback signal caused by a defect on the medium. Also included is a means for controlling the scanning of the medium by the flaw detection circuit means and for recording the locations of the defects on the medium in response to the error signal.

In normal user operation, the controller means may be configured to flaw scan individual data tracks during the drive's idle time. In this situation, the scanning process comprises the steps of moving the data from the selected track to an alternate location, scanning the selected track for errors, and then rewriting of the sector headers and data to the track. These steps are preferably automated under firmware control.

In one embodiment, the detection circuit comprises a quadrature phase-splitter means for splitting the readback signal into equal amplitude components which are in 90° phase quadrature. The detection circuit further comprises a means for squaring the quadrature components, and summing the results to generate a flaw signal related to the locations of the defects. A positive flaw signal corresponds to a "drop-in" condition (i.e., an increase in the playback amplitude due to a flaw), whereas a negative flaw signal denotes a "drop-out" condition (i.e., a decrease in the playback amplitude due to a flaw). At this point, the signal may be either full-wave rectified or squared, and then passed to a single threshold means. Alternatively, two threshold means—one positive and one negative—may be used to detect the drop-in and drop-out, respectively. A logic circuit means then generates the error signal by disrupting the reproduced bit pattern in response to the flaw signal.

Furthermore, incorporation of the flaw detection circuitry directly into the recording system allows automatic management of data recording system operations to overcome these defects. The flaw detection apparatus can also be employed to detect the presence of domain instabilities in the magnetic transducers.

BRIEF DESCRIPTION OF THE DRAWINGS

The present invention is illustrated by way of example and not limitation in the figures of the accompanying drawings, in which like references indicate similar elements, and in which:

FIGS. 1A–1B illustrate several different manifestations of single-bit defects in a disk drives' read channel signal.

FIG. 2 is a block diagram of one embodiment of the flaw detector apparatus incorporated in the present invention.

FIG. 3 is a block diagram of another flaw detector apparatus.

FIG. 4 illustrates yet another embodiment of an apparatus for detecting flaws in a disk drive system.

FIG. 5 is a block diagram of the currently preferred flaw detector apparatus incorporated within the drive system of the present invention.

FIG. 7 shows a detailed circuit schematic of one embodiment of the input portion FIG. 5.

FIG. 8 is a block diagram of the presently invented disk drive recording system incorporating self-test features.

FIG. 9 illustrates the sectoring method employed during flaw scanning of the media.

FIG. 10 illustrates a current implementation of the flaw scanning process of the present invention.

DETAILED DESCRIPTION

Figure 6:
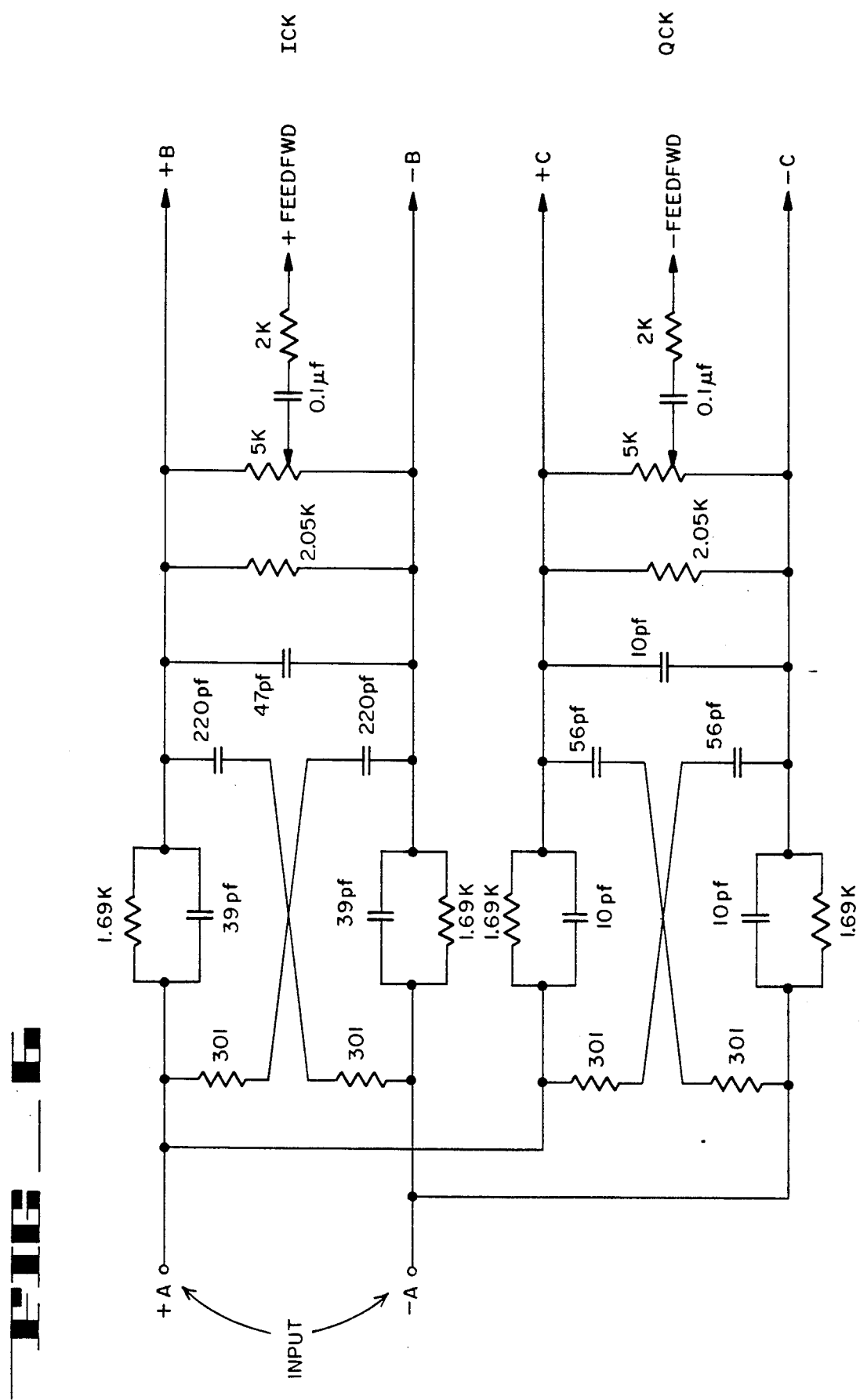
FIG. 6 shows a detailed circuit schematic diagram of the phase-splitter circuit utilized in conjunction with several embodiments of the present invention.

Most commercial media testers have little difficulty in finding large media defects. However, small single bit errors are difficult to locate and frequently result in disk drive systems being shipped with defects that are not on their internal error map. The present invention provides a disk drive system which incorporates a media flaw detection apparatus that is capable of resolving very small, single bit errors in an efficient and economical manner.

In the following description, numerous specific details are set forth, such as device types, circuit schematics, modulation codes, etc., in order to provide a thorough understanding of the present invention. However, it will be obvious to one skilled in the art, that the present may be practiced without these specific details. In other instances, well-known circuits have not been shown, or have been shown in block diagram form only, in order to avoid unnecessarily obscuring the present invention.

At maximum frequency a disk drives' read channel signal is characterized by a sinusoidal waveform. Any flaw present on the magnetic medium appears as a simultaneous amplitude and phase modulation of the sinusoidal during readback. By way of example, if a magnetic transition is stored directly on a defect or flaw, maximum amplitude modulation occurs with minimum phase error. This condition is illustrated in FIGS. 1A and 1B in which the readback sinusoid exhibits either an amplitude decrease or an amplitude increase in the readback waveform at peaks 8 and 9, respectively. FIG. 1A shows a drop-out or missing pulse resulting from maximum amplitude modulation with no bit shift. The situation of FIG. 1B depicts a drop-in or super pulse condition in which maximum amplitude modulation results, also without bit shift.

Whenever a defect falls between two magnetic transitions, the resulting pulse is characterized as having minimum amplitude error with maximum phase error. This condition is illustrated by FIGS. 1A and 1B, where a distortion (and possibly a timing error) occurs at transitions 10a and 10b. The flaws at transitions 10a and 10b are some of the most difficult to detect using conventional techniques that commonly require repeated write/read scans and which rely upon normal phase jitter to position the magnetic transition on a more favorable location so as to produce a detectable signal.

Since most defects comprise a combination of phase and amplitude error components, it is one of the objects of the present invention to provide a disk drive system which incorporates a means for detecting media defects which is equally sensitive to amplitude and/or phase errors. In accordance with the present invention, the error signal, m(t), generated in the case of a drop-out has a negative magnitude, whereas for a drop-in condition m(t) is positive. The flaw detection error signal, m(t), is shown superimposed against the waveforms in FIGS. 1A and 1B.

The block diagram of FIG. 2 illustrates one embodiment of a flaw detector which may be incorporated into the disk drive system of the present invention. In accordance with the previous discussion, the analog playback input signal of FIG. 2 represents the maximum frequency sinusoid from the recording channel equalizer. Since the ability of the detector to recognize small defects varies directly with lineal recorded density, the media is written at the highest practical constant frequency. This results in the highest possible defect resolution and produces a near-sinusoidal playback signal. By this means, any small amplitude and/or phase modulation present in the analog readback input signal can be attributed to the presence of an inconsistency in the recording medium. In the frequency domain, these deviations correspond to phase and/or amplitude modulation sidebands about the carrier.

The flaw detector of FIG. 2 is distinguished as being synchronous in nature. The digital clock input signal shown in FIG. 2 is obtained from the recovered clock of the disk drive system. Synchronous detection of phase and/or amplitude modulation sidebands provides a 3 dB signal-to-noise ratio advantage over asynchronous detection methods.

In the embodiment of FIG. 2 the recovered digital clock signal has a period equal to one detent, $T_w$ (also frequently referred to as a data bit cell time or clock window). The recovered clock is divided by four through an ordinary divider circuit 12 to produce in-phase (ICK) and quadrature-phase (QCK) local oscillator component waveforms along lines 14 and 15, respectively.

The in-phase and quadrature-phase components both have a period equal to $T_{min}$, which for the ⅔ (1,7) run-length limited (RLL) modulation code employed in the current implementation is equal to $2 \times T_w$. (Twice $T_{min}$ is equal to $4 \times T_w$ which is the period of a full cycle of the analog sine wave produced for magnetization transitions of alternating polarity separated by $T_{min}$). Therefore, the reason for dividing by four is obviously peculiar to the particular RLL modulation code employed. In more general terms, divider 12 acts to divide the frequency of the digital clock signal by N, where N is equal to the data period divided by the data bit cell time (i.e., $N = T/T_w = 2T_{min}/T_w$). For the embodiment of FIG. 2, the use of an RLL modulation code of ⅔ (1,7) dictates that circuit 12 divides by four.

Once the in-phase and quadrature-phase signal components of the recovered clock have been generated, they are multiplied with the analog readback signal. This multiplication takes place using multipliers 16 and 17, which comprise multipliers such as Analog Devices part number AD834 in the current embodiment of the flaw detector of FIG. 2. Alternatively, balanced modulators comprising either Motorola part number 1496 or 1596 may be employed to multiply the incoming signal against the local oscillator.

After the in-phase and quadrature-phase local oscillator signals are heterodyned against the incoming signal utilizing modulators 16 and 17, the respective signal components are then passed through low pass filters 18 and 19 to remove unwanted harmonics. Next, the resulting signals are squared by circuits 22 and 23. These squaring circuits comprise either a simple multiplier or balanced modulator circuit. A full-wave rectifier may also be used to square the filtered signal.

The squared signals are then summed at summer 24 to remove the dependency upon phase in the output signal. Squaring and summing the in-phase and quadrature signal components is important since it allows the circuit of FIG. 2 to take advantage of the trigonometric relationship $$COS^2(x) + SIN^2(x) = 1.$$

In the case where the error signal can be either positive or negative, the output of summer 24 is preferably passed through a squarer 20 (or fullwave rectifier), then optionally to a low pass filter 25 to remove any unwanted noise or higher frequency terms, and finally to a threshold detection device 13. Note that the output of squaring circuit 20 is basically represented as a pulse in the presence of noise, which can be filtered and then acted upon by threshold detector 13. Threshold detector 13, which may comprise an ordinary comparator, is employed to indicate the presence of a medium flaw to the controller of the disk drive system. For embodiments which do not employ squarer 13, threshold detector 13 preferably comprises a pair of threshold detection devices designed to accommodate both positive and negative values of m(t).

A fuller understanding of the invention can be had by considering the mathematics involved in the detector of FIG. 2. To begin, assume that the analog playback signal is modeled as the signal $$[1 + m(t)] \, COS \, (\omega t + \phi)$$

where m(t) is the amplitude modulating function relating to a defect, and $COS(\omega t + \phi)$ is the sinusoidal readback signal displaced in phase from m(t) by an arbitrary angle, $\phi$.

In the flaw detector circuit of FIG. 2, the disk drive's recovered clock is used as the local oscillator and is represented either by $COS(\omega t)$, the in-phase clock (also referred to as ICK, in the Figures) or, when shifted by 90°, becomes $SIN(\omega t)$, the quadrature clock (also referred to as QCK). In the upper branch of the circuit of FIG. 2, the analog carrier signal is first multiplied by ICK, the in-phase recovered clock. The signal appearing at the output of balanced modulator 16 is then represented as $$[1 + m(t)] \, COS \, (\omega t + \phi) \, COS \, (\omega t)$$

which can be rewritten as $$\frac{[1 + m(t)]}{2} [COS(\phi + 2\omega t) + COS(\phi)]$$

Similarly the output of balanced modulator 17 is represented by $$[1 + m(t)] \, COS \, (\omega t + \phi) \, SIN \, (\omega t)$$

which can be rewritten as $$\frac{[1 + m(t)]}{2} [SIN(\phi + 2\omega t) + SIN(\phi)]$$

After low pass filtering, the in-phase signal is reduced to $[1 + m(t)]/2 \, COS(\phi)$ while the low pass filter 19 in the quadrature branch of the circuit produces $$\frac{[1 + m(t)]}{2} SIN(\phi)$$

squaring each and summing yields $$\frac{[1 + m(t)]^2}{4} [SIN^2(\phi) + COS^2(\phi)]$$
$$= \frac{[1 + m(t)]^2}{4}$$
$$= [1 + 2m(t) + m^2(t)]/4$$

For small defects, m(t) is <1, m(t)² is <<1, so that the above equation is reduced to 1+m(t)/2 which, after A.C. coupling, yields the output m(t)/2.

Thus, by generating in-phase and quadrature-phase components of the signal, filtering those signals to remove unwanted harmonics, and then summing the squares of each of those components, an output term is produced which is totally independent of phase.

Recall that m(t) can be either positive or negative as illustrated in FIGS. 1A and 1B depending on whether the flaw is manifested as a missing bit (drop-out) or as an extra bit (drop-in), respectively. Consequently, a squarer 20 or full-wave rectifier is utilized in conjunction with a single threshold decision element 13. Optionally, two different thresholds may be employed obviating the need for squarer 20. In this latter case, one threshold is set for drop-ins and the other is set for drop-outs.

The approach of the present invention has several advantages. First, phase insensitivity improves repeatability and obviates the need for multiple test passes. According to the invented flaw detection scheme, repeated scans of the media are not required unless off-track defect searches are desired. As discussed previously, phase insensitivity also means that the output is independent of the position of the flaw in the write pattern.

Note that in the circuit of FIG. 2, low pass filters 18 and 19 ideally should have a cut-off frequency of 2ω to allow a maximum pass band for m(t). This completely removes unwanted terms above 2ω. In a practical filter, however, cut-off occurs at a frequency lower than 2ω. Currently, the cut-off is placed as high as possible while providing sufficient attenuation of signals at 2ω and above. Since it is desirable to preserve the fidelity of m(t), low pass sections with constant or equal-ripple delay are employed. For modest component counts, these filters have soft roll-off characteristics. Moreover, a three-pole filter with a cut-off frequency at ω has been proven to adequately resolve flaws one bit in length while suppressing higher order terms.

With reference now to FIG. 3, an alternative embodiment of the flaw detector circuit is shown. As before, the analog readback signal appearing at node 26 is input into balanced modulators 27 and 29. The recovered clock signal of the drive again acts as a local oscillator which is divided by four via divider unit 28 to generate in-phase and quadrature-phase components along lines 32 and 31, respectively. Balanced modulators 27 and 29 multiply the analog input signal with the in-phase and phase shifted digital clock to produce signal components which are subsequently squared by squaring circuits 34 and 35. The squared terms are once again summed by summer 36, squared (or full-wave rectified) by squarer 33, and then passed through low pass filter 37 to produce a phase independent detector output. Low pass filter 37 is needed to eliminate unwanted high frequency signal components. The output of low pass filter 37 is operated upon by threshold device 38 to generate the flaw error signal.

As is clearly seen, the circuit configuration of FIG. 3 is virtually identical to that of FIG. 2. The essential difference between the embodiment of FIG. 3 and the embodiment of FIG. 2 is that low pass filtering is performed after the squared terms have been summed, rather than before. Thus, the embodiment of FIG. 3 removes the two low pass filters that follow multipliers 16 and 17 in the circuit of FIG. 2.

As was the case in the detector embodiment of FIG. 2, the detector of FIG. 3 also includes upper and lower branches which multiply the playback signal by in-phase clock (ICK) and quadrature-phase clock (QCK) signals. The output of balanced modulator 27 is represented mathematically as $$\frac{[1 + m(t)]}{2} [\cos\phi + \cos(2\omega t + \phi)]$$

while the output of modulator 29 is written as $$\frac{[1 + m(t)]}{2} [\sin(\phi) + \sin(2\omega t + \phi)]$$

Squaring both signals yields $$\frac{[1 + m(t)]^2}{4} [\cos^2(\phi) +$$

$$2\cos(\phi)\cos(2\omega t + \phi) + \cos^2(2\omega t + \phi)]$$

and $$\frac{[1 + m(t)]^2}{4} [\sin^2(\phi) +$$

$$2\sin(\phi)\sin(2\omega t + \phi) + \sin^2(2\omega t + \phi)]$$

Summing each signal term yields $$\frac{[1 + m(t)]^2}{2} [1 + \sin(\phi)\sin(2\omega t + \phi)] +$$

$$\cos(\phi)\cos(2\omega t + \phi)]$$

After low pass filtering, the above equation becomes $$\frac{[1 + m(t)]^2}{2}$$

$$= [1 + 2m(t) + m^2(t)]/2$$

Once again, for small defects m(t)<1, m(t)²<<1, so that the resulting detector output becomes 1+m(t) which after AC coupling is simply the output m(t). Thus, the embodiment of FIG. 3 is twice the scale factor as the embodiment of FIG. 1, but requires only one half as many low pass filter components.

Referring now to FIG. 4, yet another embodiment of the flaw detection circuitry is shown. The detector of FIG. 4 is still synchronous and eliminates all low pass filter elements at the expense of increased circuit complexity. In the embodiment of FIG. 4, the analog and digital signals are input to phase splitters 40 and 41, respectively. Phase splitter 40 is comprised of a parallel cross-coupled RC network that generate in-phase and quadrature-phase (i.e., phase shifted by 90°) signal components. A detailed circuit schematic of the phase splitter currently employed is shown in FIG. 6. Phase splitter 41 is the divide-by-four digital circuit described above in connection with FIGS. 2 and 3.

Thus, node 44 provides an in-phase component of the analog input while node 43 provides the analog input signal shifted by 90°. Similarly, node 46 provides the in-phase digital clock oscillator signal while the quadrature component of the local oscillator appears at node 45. Each of these respective signals are input to multipliers 47-50.

The signal components appearing at each of the outputs of multipliers 47-50 are, respectively $$\frac{[1 + m(t)]}{2} [-\text{SIN}(\phi) + \text{SIN}(2\omega t + \phi)]$$

$$\frac{[1 + m(t)]}{2} [\text{COS}(\phi) + \text{COS}(2\omega t + \phi)]$$

$$\frac{[1 + m(t)]}{2} [\text{SIN}(\phi) + \text{SIN}(2\omega t + \phi)]$$

$$\frac{[1 + m(t)]}{2} [\text{COS}(\phi) - \text{COS}(2\omega t + \phi)]$$

Adding the outputs of multiplier 47 and multiplier 49 at summer 52 yields $$[1+m(t)] \text{ COS }(\phi).$$

Subtracting the output of multiplier 48 from the output of multiplier 50 at summer 53 results in $$[1+m(t)] \text{ SIN }(\phi).$$

Squaring and summing the results (via multipliers 57, 58 and summer 60) produces $$[1+m(t)]^2 = 1 + 2m(t) + m^2(t).$$

Applying the same assumptions as before the output may simply be written as $2m(t)$.

Another, more simplified version of the invented flaw detector circuit is illustrated in FIG. 5. First of all, note that the detector of FIG. 5 is asynchronous in nature. This is in contrast to the synchronous detectors of FIGS. 2, 3 and 4. Synchronous detection offers a theoretical 3 dB signal/noise ratio (SNR) improvement over asynchronous detection at small input SNR. For most modern disk drive systems, however, the input signal-to-noise power ratio is relatively large. Thus, the advantage of the embodiment of FIG. 5 is markedly reduced complexity.

In the upper branch of the detector of FIG. 5, the analog readback signal is squared by squaring circuit 66 and passed to summer 69. At the same time, in the lower branch, the analog readback signal is shifted 90° in phase by all-pass phase differencing network 65, and squared by circuit 67. Both outputs are summed at summer 69 to produce $$[1+m(t)]^2 [\text{COS}^2(\omega t+\phi)+\text{SIN}^2(\omega t+\phi)]=[1+m(t)]^2.$$

Once again, for small defects and after AC coupling the result is the desired output, $2m(t)$. This output is passed through squarer or full-wave rectifier circuit 62, and then through low pass circuit 70 to eliminate unwanted high frequency signal components. A threshold detector 63, such as an ordinary comparator, can then be used to detect the presence of a media flaw. Note that even in this asynchronous version, the detected signal is not a function of the position, $\phi$, of the defect relative to the recorded signal. That is, the detector output is independent of phase.

For a thin metal magnetic media, the output term $m(t)$ is usually negative. This results in a reduction in the amplitude of the recorded signal. However, both positive and negative values of $m(t)$ are detected by the circuit of FIG. 5 since squarer (or full-wave linear rectifier) 62 is coupled in the signal path between summer 69 and low pass filter 70. In this way, the flaw detector circuit of FIG. 5 produces an output which is insensitive to polarity. In other words, instead of $2m(t)$ being produced at the output, the flaw detector's circuitry produces an output equal to $2|m(t)|$.

Alternatively, the full wave linear rectifier or squarer 62 may be substituted with a diode bridge to produce the same result. Another possibility is to employ two comparators as a means for detecting the output threshold and then logically ORing the outputs of the comparators.

Practitioners in the art will appreciate that detecting both positive and negative values of $m(t)$ is important when scanning particular oxide disk medias, or when detecting head wiggle. Head wiggle is a random phenomena stemming from the presence of magnetic domain instability in the head element. In accordance with the invented flaw detector apparatus, head wiggle can also be detected away from the media by exciting the head gap with a sinusoidal field. Under these conditions, head wiggle manifests itself as either a positive or negative deviation from the sinusoid.

FIGS. 6 and 7 are detailed circuit schematics of the phase splitter and squarer circuits, respectively, shown in block diagram form in FIG. 5. It should be understood that the circuits of FIGS. 6 and 7 represent only one possible implementation. Ordinary practitioners in the art will understand the detailed circuit operation of the schematics of FIGS. 6 and 7.

INCORPORATION INTO A DISK DRIVE

One of the important benefits of the present invention is that it is configurable to use system functions already present on the disk drive. These functions include the automatic gain control (AGC) amplifier, the equalization filter of the disk drive's read channel circuitry, and the clock recovery phase-locked-loop (PLL) circuit. Due to its relative simplicity and low cost, all of the detector circuitry of FIG. 2 can be integrated into the drive unit itself. Moreover, because of its phase insensitivity, the detector of the present invention is capable of resolving the location of defects down to the single-bit level without multiple passes or scans of the media.

Referring to FIGS. 8 and 9, there are shown two alternative block diagrams of a disk drive system incorporating flaw detection circuitry. The additional flaw scan circuitry can either be incorporated as a plug-on module, or as a semiconductor circuit integrated directly into the data channel circuitry of the drive.

In accordance with the present invention, a maximum frequency, $F_{max}$, is first encoded onto disk 60. In the present system a ⅔ (1,7) RLL modulation code is utilized so that the encoded waveform is represented by the bit pattern 101010 . . . (i.e., CC . . . in hexadecimal notation). Upon readback by read circuit block 61, the encoded waveform appears as a sign wave. Normally, this readback waveform is then amplified and equalized by means of automatic gain control (AGC) amplifier and equalizer block 63.

The output of AGC/equalizer 63 is coupled to pulse detector 66 along line 65. Pulse detector 66 converts the analog sinusoid waveform into a series of digital ones and zeros, where the ones correspond to magnetic flux transistions on the recorded media. In the embodiment of FIG. 8, data separator 67 receives the series of digital ones and zeros generated by pulse detector 66 and produces the sync data. The sync data output from separator 67 and the pulsed flaw signal output by OR gate 74 are then ORed, as shown by gate 68. The signal output by gate 68 is then coupled to RLL decoder 69. In this manner the flaw detection circuitry is allowed to corrupt the data input to decoder 69. The output of decoder 69 is coupled to interface block 76. Upon completion of a data field read operation, an ECC check is made and the data field examined when an ECC error has been posted.

The embodiment of FIG. 9 includes most of the same basic circuit elements as that of FIG. 8 except that the output of data separator 67 is coupled to RLL decoder 69 and then to MUX 75. The selected output of MUX 75 is coupled to interface block 76, which provides a standard disk interface to an ordinary disk drive memory buffer.

In both of FIGS. 8 and 9, flaw detection circuitry 71 operates to detect minute variations on the sine wave signal present at node 65 caused by flaws on the disk media. In the currently preferred embodiment, flaw detection circuitry 71 comprises the asynchronous flaw detector described earlier in conjunction with FIGS. 5-7.

During operation, the flaw detection circuitry indicates the presence of a flaw by a logical high signal at node 73. Pulse stretcher 72 is utilized to generate a byte of 1s when a flaw has been detected at node 73. In other words, pulse stretcher 72 creates a minimum pulse width for the flaw detection error signal in order to guarantee that the flaw is recognized and located by the formatter. This signal is then coupled to one of the inputs of OR gate 74. This ensures that no errors are missed during the flaw detection process.

In FIG. 9, OR gate 74 provides the pulse output of the flaw detector circuit to MUX 75. When no flaw is present, the output of OR gate 74 is normally a string of NRZ 0s. Read channel NRZ data output from RLL decoder 69 is also coupled to MUX 75. The window strobe signal controls MUX 75 such that the selected output of the multiplexer during the data portion of data field read is from the flaw detector. At all other times the selected output is from the decoder. Sync byte and ECC are selected from the decoder output. Normally, the output of the flaw detector is seen as all NRZ 0s; however, when an error occurs, a 1 bit is set in the NRZ and located in the data field at the position relative to the defect.

The controller 80 is aware of the defect in one of two ways: Either a latch is set by the flaw detector pulse output and used as a flag that is polled by the controller 80 and reset after the controller 80 scans the data field for the defect location, or the controller 80 compares the data on the fly looking for a non-NRZ 0s condition. The window strobe control signal for the multiplexer 75 in FIG. 9 is generated by the drive's controller 80.

In normal user operation, the controller 80 may be configured to flaw scan individual data tracks during the drive's idle time. In this situation, the scanning process consists of moving the data from the selected track to an alternate location, scanning the selected track for errors, and then rewriting of the sector headers and data to the track.

The entire flaw scan process is preferably controlled by firmware code stored directly on the drive unit. Usually, when the drive is first turned on, this firmware is automatically loaded. The media scan of the disk drive using firmware control is currently performed in the manner illustrated in FIG. 10. In FIG. 9, the physical disk is first sectored as multiple small physical sectors wherein two small physical sectors are treated as one larger logical sector.

For example, during the first pass logical sector 0 comprises physical sectors 0 and 1. To begin the process the track is first DC erased. Then, starting at the index, the track is written as multiple logical sectors, each of which includes the VFO pattern, SYNCBYTE, data pattern, ECC and a gap at the end of each logical sector. Note that the SYNCBYTE indicates where the start of the data pattern lies. The data pattern, of course, comprises the $F_{max}$ bit pattern described earlier.

After the track is written, the disk is then read starting at the index. An ECC error is checked at the end of each logical sector. If, after reading the data back, an ECC error is detected, the data read is scanned for a data miscompare. If an error is found in the data, its location is recorded in memory 81. Basically, the hardware in the drive checks the incoming bit stream and looks for an ECC error. Once an ECC error is detected, the firmware searches the drive's memory 81 to determine where a break in the encoded bit pattern occurred. Recall that the bit pattern is altered whenever a flaw is detected. If no error is found, this fact is also recorded by the firmware. The firmware control also checks for missing SYNCBYTES.

After a first pass scenario of the track has been completed, the same process is repeated—but this time starting at the next physical sector. In the example above, the second pass begins at physical sector 1, as opposed to physical sector 0. This creates an overlap in the flaw scan of the physical sectors on the disk to allow a full and thorough scan of the track. Note that in FIG. 9, the data field written during the second pass extends across the ECC, gap, VFO, and SYNC regions of the first logical pass.

It should be understood that during the flaw scan process the firmware control can be used to enable the flaw detector circuitry comprising elements 71–74 of FIGS. 8 and 9. Prior to flaw scanning, this circuitry is normally disabled to conserve power. Once enabled, the flaw detector corrupts the data stream if it senses a flaw error during the time the control signal is valid. This then causes an ECC error to be detected. A subsequent scan of the memory 81 detects the location of the error.

Recognize that embedding the flaw circuitry directly into the disk drive unit in the form of an integrated circuit provides numerous benefits. By way of example, the power consumption can be effectively managed by only enabling the flaw detector circuitry during the flaw scan process. At all other times, the flaw scan circuitry can be disabled. This is easily accomplished using firmware control.

More fundamentally, integrating the flaw scan detector into the data channel allows the user a cost effective means of low level formatting and scanning of the drive on a periodic basis. This is particularly attractive since the future trend of magnetic recording is to lower flying heads—including quasi and full-fledged contact recording. Under these circumstances, the disk media will experience increased wear, resulting in a greater number of flaws developing over the lifetime of the disk. With the flaw scan circuitry embedded directly into the drive the user can reformat and re-scan the drive for flaws periodically—continually adding to the list of errors and flaws previously found. Note that the flaw scan firmware itself may be implemented as part of the standard code installed onto the drive unit. Practitioners in the art will appreciate that, from a reliability standpoint, the present invention provides numerous advantages over prior art flaw detection schemes.

It should also be understood that the foregoing disclosure relates only to current embodiments of the present invention and that modifications may be made without departing from the nature and scope of the present invention. The terms and expressions which have been employed here are used as terms of description and not of limitation, and there is no intention in the use of such terms and expressions of excluding equivalents of the features shown and described, or portions thereof—it being recognized that various modifications are possible within the scope of the invention claimed.

What is claimed is:

1. A disk drive system comprising:
   a memory storing an encoded bit pattern;
   a magnetic recording medium;
   a read channel means coupled to said magnetic recording medium for producing a readback signal from said bit pattern previously stored on said medium;
   a means for reproducing said bit pattern from said readback signal;
   circuit means coupled to receive said readback signal for detecting a defect on said medium manifested by a distortion in said readback signal, said circuit means outputting a flaw detection signal in response to said defect;
   logic means for combining said flaw detection signal with said reproduced bit pattern to alter data at a position in said reproduced bit pattern corresponding to the location of said defect on said medium, said logic means outputting an altered bit pattern;
   controller means for controlling the scanning of said medium by comparing said altered bit pattern with said encoded bit pattern, in the event of a miscompare said controller means recording in said memory said location of said defect.

2. The system of claim 1 wherein said circuit means comprises:
   phase-splitter means for splitting said readback signal into in-phase and quadrature-phase components;
   means for squaring said in-phase and quadrature-phase components and summing the results to generate a flaw signal having an amplitude modulated in relation to the locations of said defects; and
   means for detecting when said flaw signal exceeds a predetermined level and outputting said flaw detection signal in response thereto, said flaw detection signal having a longer duration as compared to said flaw signal.

3. The system of claim 2 wherein said circuit means further comprises:
   low pass filter means coupled to receive said flaw signal from said squaring means; and
   summing means for removing unwanted harmonics in said flaw signal.

4. The system of claim 2 wherein said detecting means is responsive to both positive and negative values of said flaw signal.

5. The system of claim 2 wherein said circuit means is an integrated circuit which is normally disabled within said system, said controller means enabling said integrated circuit prior to flaw scanning of said medium.

6. The system of claim 5 wherein said controller means comprises firmware code stored on said medium.

7. A magnetic disk drive recording system comprising:
   a magnetic recording medium for storing information in the form of magnetic transitions;
   a memory;
   a read channel means for retrieving said information from said medium, said read channel means comprising:
   a means for reading said medium to produce an analog signal which corresponds to said magnetic transitions;
   a means for translating said analog signal into digital data;
   said read channel means further including a flaw detector means coupled to receive said analog signal from said reading means for detecting a defect on said medium, said defect being manifested by a distortion in said analog signal, said flaw detector means outputting a flaw detection signal when said defect is detected;
   logic means coupled to said translating means for combining said flaw detection signal with said digital data to produce an altered data field of said information at a position relative to said defect; and
   controller means responsive to said altered data field for recording in said memory the location on said medium where said defect occurred.

8. The system of claim 7 wherein said flaw detector means comprises:
   phase-splitter means for splitting said analog signal into in-phase and quadrature-phase components; and
   means for squaring said in-phase and quadrature-phase components and summing the results to generate said flaw signal having an amplitude modulated in relation to the locations of said defects;
   means for detecting when said flaw signal exceeds a predetermined level and outputting said flaw detection signal in response thereto, said flaw detection signal having a longer duration as compared to said flaw signal.

9. The system of claim 8 wherein said flaw detector means further comprises:
   low pass filter means coupled to receive said flaw signal from said squaring means; and
   summing means for removing unwanted harmonics in said flaw signal.

10. The system of claim 7 wherein said flaw detector means is an integrated circuit which is normally disabled within said system, said controller means enabling said integrated circuit prior to flaw scanning of said medium.

11. The system of claim 7 wherein said controller means comprises firmware code stored on said medium.

12. The system of claim 11 wherein controller means further comprises a means for moving data stored on a selected track to an alternate location, and for rewriting said data back to said selected track after said selected track has been flaw scanned.

13. A disk drive system comprising:

a magnetic recording medium storing an encoded waveform;

a read channel generating a readback waveform from said encoded waveform on said medium, said readback waveform being distorted at a position corresponding to the location of a defect on said medium;

a pulse detector coupled to said read channel for converting said readback waveform into a series of digital ones and zeros corresponding to magnetic flux transitions on said medium;

a decoder coupled to said pulse detector for receiving said series of digital ones and zeros and producing a field of decoded data therefrom;

a flaw detector circuit coupled to receive said readback waveform, said flaw detector circuit outputting a flaw detection signal in response to said distorted position of said readback waveform;

a logic circuit for combining said flaw detection signal with said field of decoded data, thereby altering said field in correspondence to said location of said defect on said medium.

14. The disk drive system of claim 13 wherein said encoded waveform is represented by the bit pattern 101010....

15. The disk drive system of claim 13 further comprising:

a memory;

a controller recording the location of said defect in said memory in response to said altered field of decoded data.

16. The disk drive system of claim 15 wherein said flaw detector circuit is normally disabled, said controller enabling said flaw detector circuit prior to scanning a selected data track of said medium.

* * * * *